United States Patent
Hocheng et al.

(10) Patent No.: US 7,303,703 B2
(45) Date of Patent: Dec. 4, 2007

(54) NANO-IMPRINT SYSTEM WITH MOLD DEFORMATION DETECTOR AND METHOD OF MONITORING THE SAME

(76) Inventors: Hong Hocheng, No. 101, Sec. 2, Guangfu Rd., Hsinchu City 300 (TW); Chin Chung Nien, No. 195, Sec. 4, Jhongsing Rd., Jhudong Township, Hsinchu County 300 (TW)

( * ) Notice: Subject to any disclaimer, the term of this patent is extended or adjusted under 35 U.S.C. 154(b) by 679 days.

(21) Appl. No.: 10/791,926

(22) Filed: Mar. 2, 2004

(65) Prior Publication Data

US 2007/0246849 A1    Oct. 25, 2007

(30) Foreign Application Priority Data

Nov. 27, 2003    (TW) .............................. 92133432 A

(51) Int. Cl.
  B29C 43/58        (2006.01)
  B29C 45/76        (2006.01)
(52) U.S. Cl. ..................... 264/40.1; 264/293; 425/136; 425/149; 425/385; 977/887
(58) Field of Classification Search ................ 425/149, 425/385, 136; 977/887; 264/293, 406, 40.1
See application file for complete search history.

(56) References Cited

U.S. PATENT DOCUMENTS

| 5,472,331 | A | * | 12/1995 | Watkins | ....................... 425/149 |
| 5,772,905 | A | * | 6/1998 | Chou | ........................... 216/44 |
| 6,309,580 | B1 | | 10/2001 | Chou | ........................... 264/338 |
| 6,769,897 | B2 | * | 8/2004 | Eppich et al. | ............... 425/151 |
| 2001/0022406 | A1 | * | 9/2001 | Woodmansee et al. | ..... 264/40.5 |
| 2002/0097059 | A1 | * | 7/2002 | Tartagni et al. | .............. 324/687 |
| 2003/0209817 | A1 | * | 11/2003 | Lee et al. | ..................... 264/1.1 |
| 2004/0009252 | A1 | * | 1/2004 | Reichstein et al. | ......... 425/143 |
| 2004/0238821 | A1 | * | 12/2004 | Yang | ........................... 257/72 |
| 2005/0003036 | A1 | * | 1/2005 | Nishimura et al. | ......... 425/135 |
| 2005/0084557 | A1 | * | 4/2005 | Fueller et al. | .............. 425/170 |

* cited by examiner

*Primary Examiner*—Yogendra N. Gupta
*Assistant Examiner*—Emmanuel S Luk

(57) ABSTRACT

A system for nano-imprint with mold deformation detector is disclosed for real-time monitoring of the deformation of the mold. An electrostatic plate capacitor is embedded in the mold, serving as the deformation detector. The capacitor includes two opposite metal film electrodes formed by silicon micromachining technique on opposite surfaces of the mold and connected by a metal lead. During imprinting, the mold is acted upon by an external force and deformation occurs, which induces change of distance between the metal film electrodes and thus variation of the capacitance of the capacitor. The amount of deformation of the mold can then be assessed by comparing the capacitance with a reference. Thus, real-time detection and monitoring of the deformation of the nano-imprint mold is realized. Also disclosed is a method for carrying out the real-time monitoring of the deformation of the mold.

14 Claims, 6 Drawing Sheets

NANO-IMPRINT SYSTEM WITH MOLD DEFORMATION DETECTOR AND METHOD OF MONITORING THE SAME

FIELD OF THE INVENTION

The present invention relates generally to a nano-imprint system incorporating mold deformation detection, and in particular to a nano-imprint system comprising a mold in which an electrostatic plate capacitor is embedded to function as deformation detector whereby real-time detection and monitoring of the deformation of the mold can be realized.

BACKGROUND OF THE INVENTION

With the advent of the nano-technology, the need of nano-structures of atom-level precision is dramatically increased. Thus, a variety of nano-imprinting techniques are developed, such as micro-contact printing, scanning probe-based techniques and nano-imprint lithography. Among these techniques, the nano-imprint lithography allows for repeated printing with one single mold that is obtained with one single lithography step. The nano-imprint lithography is thus one of the most promising techniques for nano-imprinting, having the advantages of low cost and high yield with wild applications in for example nano-electronics, optic devices, high density storage devices, nano-electro-mechanical systems, bio-devices, transducers and nano-electromagnetic devices.

The factors that affect the development of the nano-imprinting lithography includes alignment between layers in a multi-layer imprinting process, yield and acceptable rate of products in large-scale molding, manufacturing of mold for high density patterns, low yield rate caused by work adherence to mold, control of temperature and pressure of mold imprinting and deformation and service life of the mold. Among these factors, deformation of mold plays a key role in determining the quality of the nano-scale products. Once the deformation of mold exceeds an acceptable level, the nano-structure printed loses uniformity, leading to poor quality of the associated products. This is particular of concern in high speed imprinting process that makes a great number of imprinting products in a short time. Thus, the deformation of the mold must be monitored from time to time to ensure high quality products. The deformation that is of concern in nano-imprinting is of nano orders and thus real-time monitoring is necessary.

In nano-imprinting techniques, precision of molds is a key indication for quality of the imprinted products. Although theories of material mechanics and computers can be effectively used to establish micro-element model for the prediction of mold deformation, the difference between theoretical solution and practical applications always leads to unacceptable predictions of the practical influence caused by mold deformation. Further, the known techniques do not provide real-time monitoring scheme and cannot be employed in automation of nano-imprinting.

SUMMARY OF THE INVENTION

Therefore, a primary objective of the present invention is to provide a nano-imprint system comprising a mold in which an electrostatic plate capacitor is embedded, a detection device coupled to the electrostatic plate capacitor for detection of deformation of the mold during an imprinting process and an external monitoring device coupled to the detection device for receiving, recording and displaying the result of detection and selectively issuing a warning or automatically shutting down the system based on the detection result. The electrostatic plate capacitor is comprised of two planar metal film electrodes formed on opposite surfaces of the mold by silicon micromachining techniques. The metal film electrodes are spaced from each other at a distance, and capacitance of the capacitor is a function of the distance. During the imprinting process, an external force, such as a reaction of a work, acts upon the mold and causes deformation of the mold, resulting in change of the distance between the metal film electrodes and thus variation of the capacitance of the capacitor. Based on a comparison between the capacitance and a reference value, the amount of deformation can be calculated.

Another objective of the present invention is to provide an automatic real-time monitored nano-imprint system, wherein the detection device detects the capacitance of the electrostatic plate capacitor embedded in the mold and issues a digital signal corresponding to the capacitance. The digital signal is fed to the external monitoring device and displayed. The external monitoring device thus receives the real time detection of the capacitance and displays the result immediately. The external monitoring device may be programmed and set in such a manner to automatically shut down the system once abnormal or unacceptable condition happens. Transmission of signals between the detection device and the external monitoring device can be done with physical connections or wireless connections.

The external monitoring device that receives the capacitance of the electrostatic plate capacitor embedded in the mold may selectively display the capacitance or convert the capacitance into a corresponding amount of mold deformation and display the deformation. The data displayed may be used as an indication for on-line determination of shut-down of the system, serving as an automatic quality control means. As such, the present invention provides a system that allows for immediate detection and direct display of the detection for observation and monitoring of the mold deformation.

To monitor the mold deformation in accordance with the present invention, an initial value of the capacitance of the electrostatic plate capacitor is obtained first before an imprinting process gets started. The values of the capacitance at selected time points are detected during the imprinting process by a detection circuit and then modulated by a modulation circuit, converted into a digital signal by an analog-to-digital converter and processed by a processing circuit to provide the amount of deformation, which is applied to the external monitoring device for direct display or feedback to the nano-imprint system for selectively shutting down the system.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENTS

Figure 1:
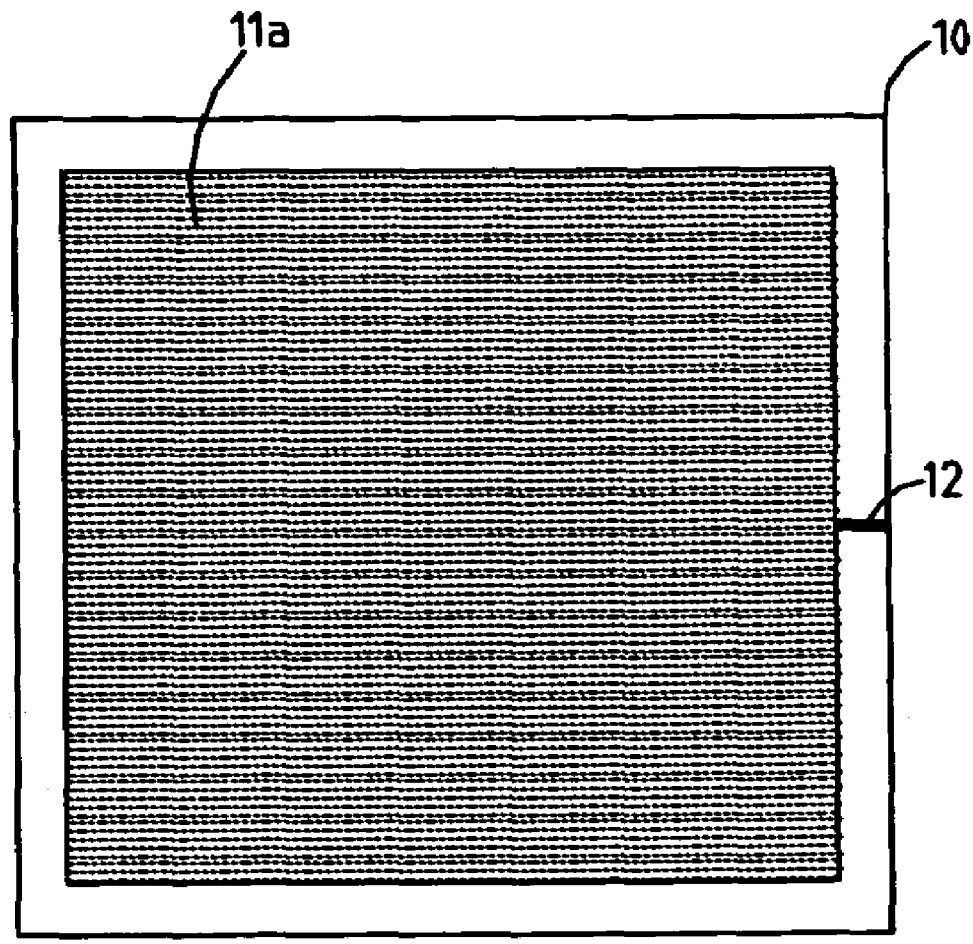
FIG. 1 is a plan view of a nano-imprint mold constructed in accordance with the present invention in which an electrostatic plate capacitor is embedded.

With reference to the drawings and in particular to FIG. 1, which shows a plan view of a nano-imprint mold constructed in accordance with the present invention, in which an electrostatic plate capacitor is embedded to serve as a detector for deformation of the mold, the mold of the present invention comprises a mold body 10 having a first surface facing outward, in which a first planar metal film electrode 11a is embedded. A metal lead 12 is also embedded in the mold body 10 and is electrically connected to the first metal film electrode 11a. In accordance with the present invention, both the first metal film electrode 11a and the metal lead 12 are formed by silicon micromachining technique on the mold body 10 whereby the first metal film electrode 11 and the metal lead 12 are completely integrated with the mold body 10.

Figure 2:
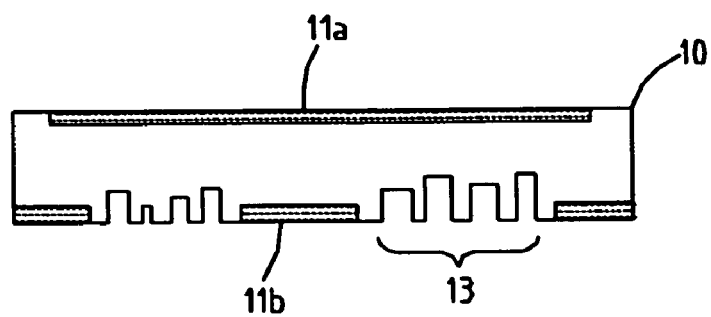
FIG. 2 is a side elevational view of the nano-imprint mold of the present invention.
Figure 3:
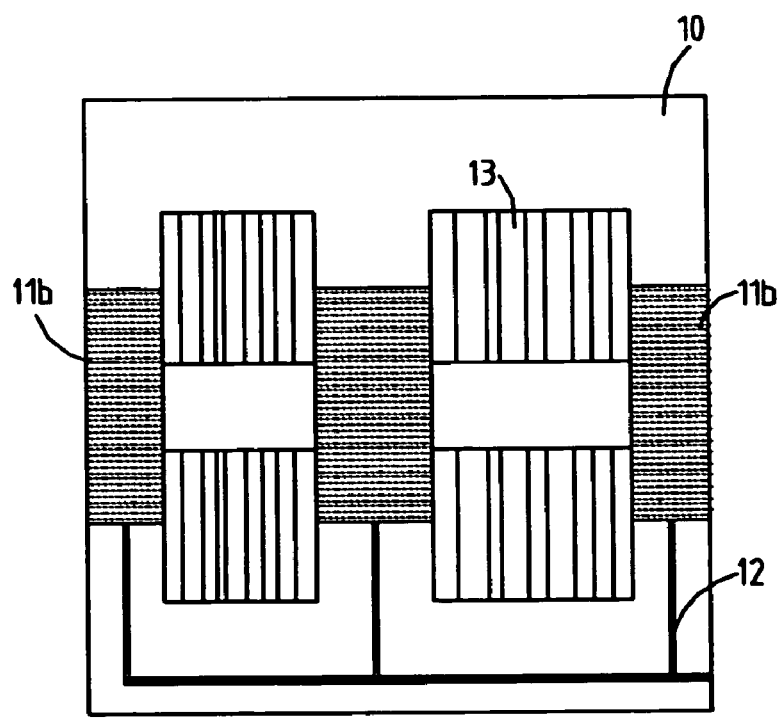
FIG. 3 is a bottom view of the nano-imprint mold of the present invention.

Also referring to FIGS. 2 and 3, which show a side elevational view and a bottom view of the nano-imprint mold of the present invention, respectively, a second planar metal film electrode 11b is formed on a second, imprinting surface of the mold body 10, opposite to the first surface. Preferably, the second metal film electrode 11b is formed by silicon micromachining technique on the second, imprinting surface of the mold body 10. The metal lead 12 extends between the first and second metal film electrodes 11a, 11b thereby forming an electrostatic plate capacitor in which the first and second metal film electrodes 11a, 11b are spaced from each other at a distance.

On the imprinting surface of the mold body 10, areas 13 carrying imprinting patterns of micro-scale or nano-scale are formed. The metal lead 12 is formed on the mold body 10 in such a way not to overlap the patterned areas 13.

It is apparent to those having ordinary skills that the size, quantity and location of the metal lead 12 and the metal film electrodes 11a, 11b may vary in accordance with practical requirements of applications of imprinting process. No constrain is imposed on these factors and other geometrical factors, such as shapes.

The present invention provides a nano-imprint system comprised of a mold comprising the mold body 10, the first and second metal film electrodes 11a, 11b, the metal lead 12 and the patterned areas 13. The first and second metal film electrodes 11a, 11b and the metal lead 12 that are embedded in the mold body 10 as an electrostatic plate capacitor function to detect deformation of the mold body 10 by detecting the variation of the distance between the first and second metal film electrodes 11a, 11b during an imprinting process. Before the imprinting process starts, the distance between the first and second metal film electrodes 11a, 11b assumes constant and is taken as "reference distance". Once the imprinting process starts, an external force is applied to the mold body 10 by a work (not shown), causing deformation of the mold body 10. The distance between first and second metal film electrodes 11a, 11b varies as a function of the deformation of the mold body 10. The capacitance of the electrostatic plate capacitor comprised of the first and second film electrodes 11a, 11b changes with the variation of the distance between the first and second metal film electrodes 11a, 11b. Thus, the deformation of the mold body 10 can be assessed by detecting the change of the capacitance of the electrostatic plate capacitor comprised of the first and second metal film electrodes 11a, 11b and the metal lead 12.

Figure 4:
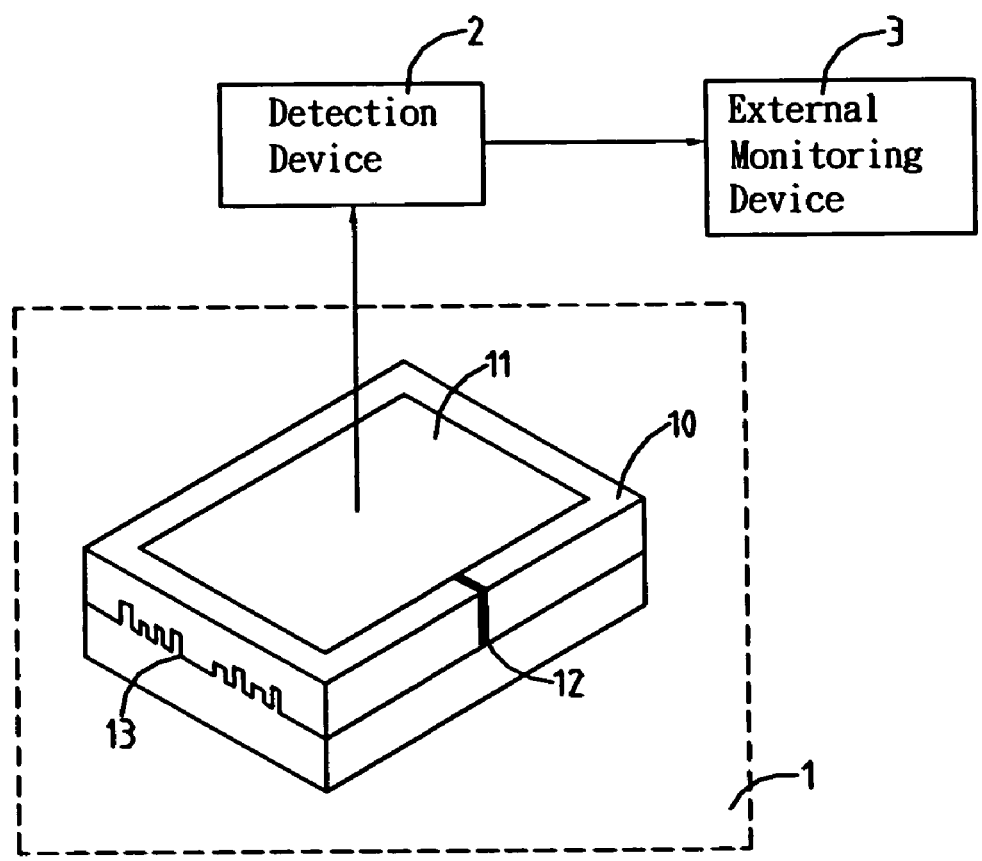
FIG. 4 is a schematic view of a nano-imprint system incorporating mold deformation detection in accordance with the present invention.

FIG. 4 shows an example of a nano-imprint system to which the deformation detector is incorporated. As mentioned above, the nano-imprint system, which is designated with reference numeral 1 in FIG. 4, comprises the mold body 10 in which the electrostatic plate capacitor comprised of first and second metal film electrodes that are collectively designated with reference numeral 11 in FIG. 4 and the metal lead 12 is embedded and a detection device 2 coupled to the electrostatic plate capacitor for detecting the capacitance of the electrostatic plate capacitor. An external monitoring device 3 is connected to and receives a detection result from the detection device 2. The external monitoring device 3 also displays the detection result to an operator. If desired, the external monitoring device 3 may include decision-making means that issues a warning signal based on the detection result. Such a warning signal allows an operator to manually stop the imprinting process in case that the amount of deformation exceeds a predetermined limit that is set to ensure precision of imprinted work.

Figure 5:
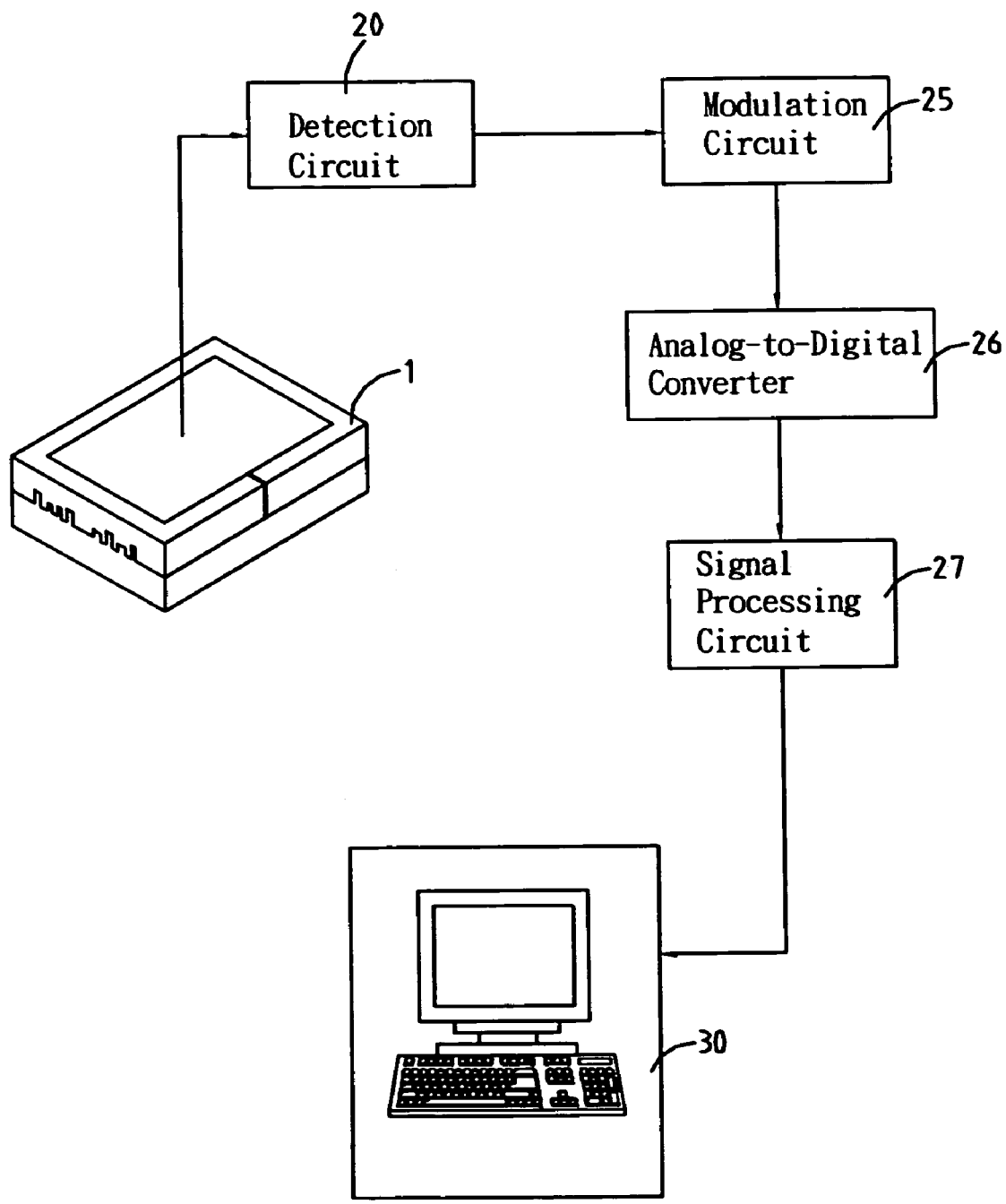
FIG. 5 is a block diagram of a detection circuit for detecting deformation of the mold in accordance with the present invention.

Also referring to FIG. 5, a more detailed example of the nano-imprint system in accordance with the present invention is shown. The detection device 2 may comprise a detection circuit 20 that gives off a detection signal representing the capacitance of the electrostatic plate capacitor comprised of the first and second metal film electrodes 11a, 11b at a particular time point. The detection signal, which is analog, is processed by a modulation circuit 25 and then converted into a digital signal by an analog-to-digital converter 26. A signal processing circuit 27 is coupled to the analog-to-digital converter 26 to receive the digital signal issued by analog-to-digital converter 26 and compare the digital signal that indicates the capacitance (or equivalently the distance between the first and second metal film electrodes 11a, 11b) detected at the particular time point. The signal processing circuit 27 may also process the digital signal to calculate an amount of deformation at the particular time point.

The external monitoring device 3 may comprise a computer 30 that receives the result of processing from the signal processing circuit 27 and displays the amount of deformation to an operator by means of the computer display (not labeled). The operator may decide, based on his or her discretion and experience, if the amount of deformation is unacceptable in maintaining imprinting precision and then manually shut down the system. Alternatively, decision-making means, which may be in the form of software, may be incorporated in the computer 30 to decide if the amount of deformation is tolerable for imprinting precision. If desired, the computer 30 may be programmed to automatically shut down the system in case of excessive amount of deformation.

Figure 6:
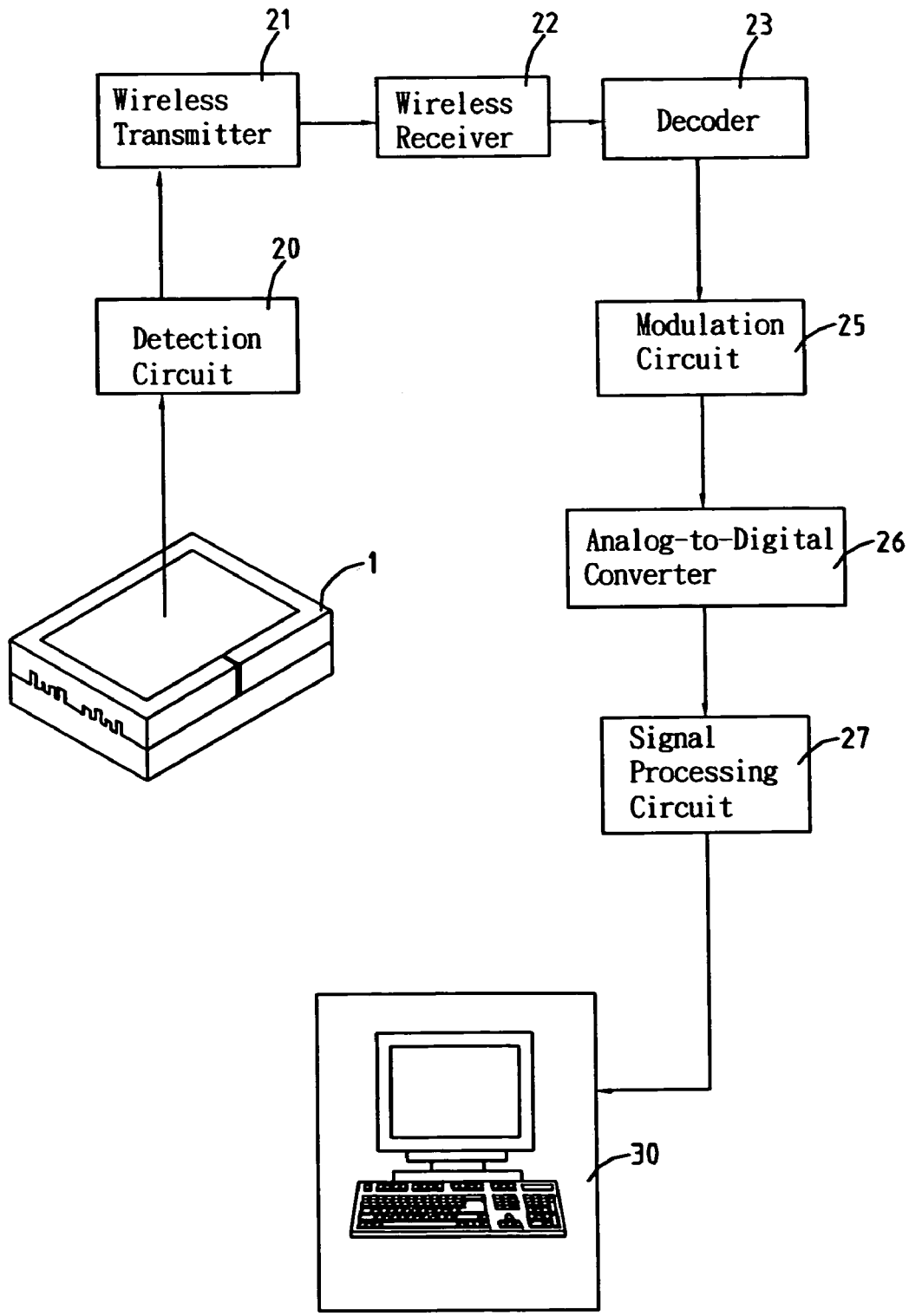
FIG. 6 is a block diagram of a detection circuit for detecting deformation of the mold in accordance with the another embodiment of the present invention.

Coupling between the detection device 2 and the external monitoring device 3 can be physical connections, such as a cable, or implemented in a wireless manner. This is applicable between the parts or circuits comprised of the detection device 2. FIG. 6 shows an example in which a wireless coupling is provided between the detection circuit 20 and the signal modulation circuit 25. The detection result of the detection circuit 20 is fed to a wireless transmitter 21 that encodes and transmits an electromagnetic signal, such as radio frequency signal or infrared signal, corresponding to the detection result. The electromagnetic signal is received by a wireless receiver 22 and then decoded by a decoder 23, if necessary, to provide an electrical signal that corresponds to detection signal and is applied to the modulation circuit 25 and then passing through the analog-to-digital converter 26 and the signal processing circuit 27 in the same manner as described above.

Figure 7:
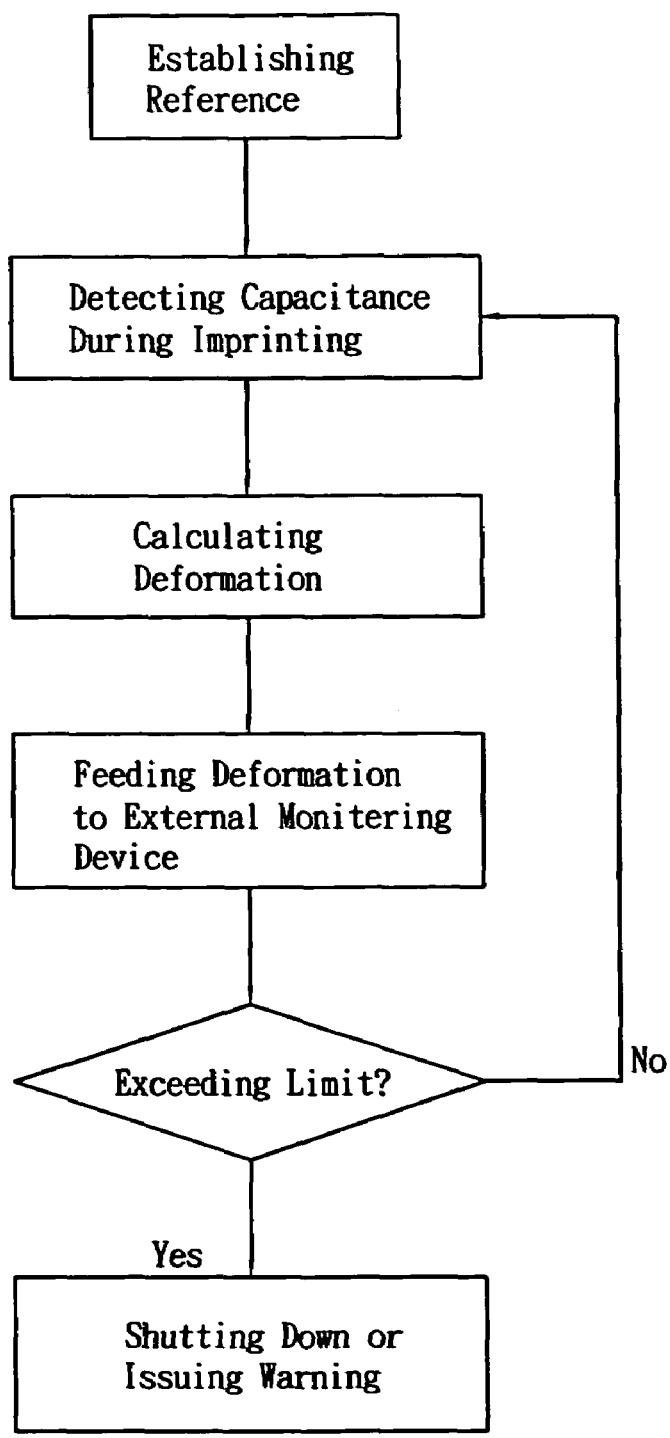
FIG. 7 is a flow chart showing a method of monitoring deformation of mold in accordance with the present invention.

A method for monitoring deformation of the mold is demonstrated in the flowchart illustrated in FIG. 7. Initially, a reference is established before the imprinting process with the imprint gets started. Such a reference is the initial capacitance of the electrostatic plate capacitor embedded in the mold detected at a time point before the imprinting starts, that is presumably a time point when the mold is not acted upon by an external force and thus is not deformed. Once the imprinting process gets started and is carried out continuously, the detection device 2 detects the capacitance of the capacitor at a selected time point. The detection result is then processed in the manner described above and converted into an amount of deformation of the selected time point. The amount of deformation of the selected time point is supplied to and recorded by the external monitoring device 3. The external monitoring device 3, based on the algorithm established beforehand, determines if the amount of deformation exceeds a predetermined limit that is determined on the basis of the reference capacitance. When the amount of deformation does not exceed the predetermined limits, the detection device 2 detects the capacitance of the capacitor at a next time point and the process goes over again. If the amount of deformation exceeds the limit, then a warning is issued or the system is shut down automatically.

To this point, it is apparent that the present invention provides a real-time intellectual system for monitoring the deformation of a mold in order to ensure the imprinting precision. The electrostatic capacitor that is embedded in a mold functions to real-time monitor the deformation of the mold, allowing for quick and efficient monitoring of the imprinting process.

Although the present invention has been described with reference to the preferred embodiment thereof and the best mode for carrying out the invention, it is apparent to those skilled in the art that a variety of modifications and changes may be made without departing from the scope of the present invention which is intended to be defined by the appended claims.

What is claimed is:

1. An apparatus for monitoring mold deformation in nano-imprint, comprising:
    a mold body having a first surface and an opposite second surface, imprinting patterns being formed in areas of the second surface;
    an electrostatic plate capacitor comprising first and second metal film electrodes respectively embedded in the first and second surfaces of the mold body and spaced a distance from each other and a metal lead embedded in the mold body and connecting the first and second metal film electrodes;
    a detection device detecting a capacitance of the electrostatic plate capacitor and comprising means for converting the capacitance into an amount of deformation of the mold body; and
    an external monitoring device receiving a signal representing the amount of deformation from the detection device and selectively recording and displaying the amount of deformation and comprising means for comparing the amount of deformation with a reference to determine if the amount of deformation exceeds the reference and selectively issuing a warning and shutting down the system.

2. The apparatus as claimed in claim 1, wherein the imprinting patterns of the mold body selectively comprise micro-scale patterns and nano-scale patterns.

3. The apparatus as claimed in claim 1, wherein the metal film electrodes are formed on the mold body without overlapping the imprinting patterns.

4. The apparatus as claimed in claim 1, wherein the electrostatic plate capacitor and the detection device are coupled to the external monitoring device by a cable.

5. The apparatus as claimed in claim 1, wherein the electrostatic plate capacitor and the detection device are coupled to the external monitoring device in a wireless manner.

6. The apparatus as claimed in claim 5, wherein the wireless coupling comprises a wireless transmitter that receives and encodes the detection result from the detection device and transmits a wireless signal and a wireless receiver that receives the wireless signal and a decoder that decodes the received wireless signal and applies a corresponding signal to the external monitoring device.

7. The apparatus as claimed in claim 1, wherein the detection device comprises a detection circuit for detecting the capacitance of the electrostatic plate capacitor and issues a detection signal, a modulation circuit for modulating the detection signal and issuing a modulated signal, an analog-to-digital converter that receives and converts the modulated signal into a digital signal, and a signal processing circuit that processes and converts the digital signal into the amount of deformation of the mold body.

8. The apparatus as claimed in claim 7, wherein the detection circuit, the modulation circuit, the analog-to-digital converter and the signal processing circuit are coupled by physical electrical connections.

9. The apparatus as claimed in claim 7, wherein the detection circuit, the modulation circuit, the analog-to-digital converter and the signal processing circuit are coupled by wireless connections.

10. The apparatus as claimed in claim 9, wherein the wireless coupling comprises a wireless transmitter that receives and encodes a first signal and transmits a wireless signal and a wireless receiver that receives the wireless signal and a decoder that decodes the received wireless signal and issues a corresponding second signal.

11. A method for monitoring amount of deformation of a nano-imprint mold comprising the following steps:
    (1) detecting and recording a reference capacitance of an electrostatic plate capacitor embedded in the nano-imprint mold at a first time point before the start of an imprinting process carried out with the nano-imprint mold;
    (2) detecting a capacitance of the electrostatic plate capacitor at a second time point after the imprinting process is being carried out;

(3) processing the capacitance detected at the second time point to obtain an amount of deformation of the nano-imprint mold;
(4) feeding the amount of deformation to an external monitoring device and recording the amount of the deformation;
(5) using the external monitoring device to display and selectively determine if the amount of deformation exceeds a limit that is determined on the basis of the reference capacitance; and
(6) if the amount of deformation exceeds the limit, then selectively issuing warning and selectively stopping the imprinting process otherwise repeating steps (2)-(5).

12. The method as claimed in claim 11, wherein in step (2), the capacitance of the electrostatic plate capacitor is detected by a detection circuit.

13. The method as claimed in claim 11, wherein in step (3), the capacitance is detected by a circuit and represented as an electrical signal and wherein step (3) further comprises the following sub-steps:
(A) modulating the signal representing the capacitance to issue a modulated signal;
(B) converting the modulated signal into a digital signal; and
(C) comparing the digital signal with the reference capacitance and calculating the amount of deformation.

14. The method as claimed in claim 11, wherein in step (5), the amount of deformation is directly displayed on a display device of the external monitoring device.

* * * * *